United States Patent
Xu et al.

(10) Patent No.: US 11,600,493 B2
(45) Date of Patent: Mar. 7, 2023

(54) SEMICONDUCTOR DEVICE AND METHOD FOR MANUFACTURING THE SAME

(71) Applicant: SHANGHAI HUALI MICROELECTRONICS CORPORATION, Shanghai (CN)

(72) Inventors: Pengkai Xu, Shanghai (CN); Fulong Qiao, Shanghai (CN); Wenyan Sun, Shanghai (CN); Yu Huang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 17/389,182

(22) Filed: Jul. 29, 2021

(65) Prior Publication Data
US 2022/0068656 A1   Mar. 3, 2022

(30) Foreign Application Priority Data
Aug. 25, 2020   (CN) .......................... 202010864457.2

(51) Int. Cl.
| H01L 21/3105 | (2006.01) |
| H01L 21/311 | (2006.01) |
| H01L 27/11531 | (2017.01) |
| H01L 27/11524 | (2017.01) |

(52) U.S. Cl.
CPC .. *H01L 21/31053* (2013.01); *H01L 21/31051* (2013.01); *H01L 21/31111* (2013.01); *H01L 27/11531* (2013.01); *H01L 27/11524* (2013.01)

(58) Field of Classification Search
None
See application file for complete search history.

(56) References Cited

FOREIGN PATENT DOCUMENTS

| CN | 109950207 | * | 6/2019 | ............. H01L 21/28 |
| CN | 111312590 | * | 6/2020 | ............ H01L 21/336 |

* cited by examiner

*Primary Examiner* — Jiong-Ping Lu
(74) *Attorney, Agent, or Firm* — Alston & Bird LLP

(57) ABSTRACT

The present disclosure provides a method for manufacturing a semiconductor device, including: providing a substrate having a plurality of stacked gates with silicon nitride mask layer and silicon oxide mask layer formed on top of the surface; depositing a first carbon-containing silicon oxide thin layer; depositing a second non-carbon-containing silicon oxide layer to fill the gaps between adjacent stacked gates; and planarizing the first silicon oxide thin layer and the second silicon oxide layer by applying the silicon nitride mask layer as a stop layer, removing the second silicon oxide layer, and forming the first sidewalls with the first silicon oxide thin layer on the sides of the stacked gates. The present disclosure further provides a semiconductor device made with the method thereof. The present disclosure can remove the silicon oxide mask layer above the stacked gates through a simple process flow.

10 Claims, 10 Drawing Sheets

SEMICONDUCTOR DEVICE AND METHOD FOR MANUFACTURING THE SAME

CROSS-REFERENCES TO RELATED APPLICATIONS

This application claims the priority to Chinese patent application No. CN202010864457.2 filed on Aug. 25, 2020, and entitled "SEMICONDUCTOR DEVICE AND METHOD FOR MANUFACTURING THE SAME", the disclosure of which is incorporated herein by reference in entirety.

TECHNICAL FIELD

The invention relates to the field of semiconductor devices and manufacturing thereof, in particular to a gate etching process in a self-alignment double pattern process.

BACKGROUND

With the development of semiconductor technology, particularly in the process of entering 24 nm node and below, self-alignment double pattern (SADP) process has been increasingly applied, especially in the gate etching process. Taking the flash memory devices as an example, each of the select gate of the storage area and the peripheral gate of the peripheral area has a different film structure than the control gate in the storage area does before etching the silicon oxide mask layer above these gates, thickness differences of the remaining silicon oxide mask layer above the gates occur after the gate etching process. The thickness of the silicon oxide mask layer above both the select gate and the peripheral gate is significantly larger than the silicon oxide mask layer above the control gate. This difference in the thicknesses of the silicon oxide mask layer over various gates has reduced the process window of subsequent processes, for example the subsequent interlayer dielectric layer etching, gate cut-off etching, and other processes.

In the current process, in order to solve this problem, a new vapor phase wet etching process is introduced. After the gate etching process, the remaining silicon oxide mask layer is completely removed, thereby eliminating the thickness non-uniformity in the silicon oxide mask layer. Then, a sidewalls film layer is deposited and etched. FIGS. 1A-1D show the process flow used in the existing arts to solve the above-mentioned problem.

As shown in FIG. 1A, after the gate etching process, gates with different film structures are formed, including a first stacked gate 210 for a memory transistor and a second stacked gate 220 for a selection transistor, both in a memory area A, and a third stacked gate 230 for a peripheral device in a peripheral area B. Taking the first stacked gate 210 as an example, the film structure of the first stacked gate is a control gate film layer 213, an interlayer dielectric layer 212, and a floating gate film layer 211, listed from top to bottom. It can be understood that the film structures of the second stacked gate 220 and the third stacked gate 230 also include a control gate film layer, an interlayer dielectric layer, and a floating gate film layer, listed from top to bottom. The control gate film layer and the floating gate film layer may be polysilicon, and the interlayer dielectric layer is usually a silicon oxide-silicon nitride-silicon oxide layer, that is, an ONO layer.

It can be seen from FIG. 1A that the first stacked gate 210, the second stacked gate 220, and the third stacked gate 230 have the same height. The width of the first stacked gate 210 is smaller than the width of the second stacked gate 220 and also the width of the third stacked gate 230.

A silicon nitride mask layer and a silicon oxide mask layer are sequentially formed above each stacked gate. The silicon nitride mask layer 311 above the first stacked gate 210, the silicon nitride mask layer 321 the second stacked gate 220, and the silicon nitride mask layer 331 above the third stacked gate 230 have the same thickness.

However, the thickness of the silicon oxide mask layer 312 above the first stacked gate 210 is smaller than the thickness of the silicon oxide mask layer 322 above the second stacked gate 220 and also the thickness of the silicon oxide mask layer 332 above the third stacked gate 230.

After forming different gate structures, in order to eliminate the thickness difference between the silicon oxide mask layers 312, 322, and 332, a vapor phase wet etching process is applied to remove the silicon oxide mask layer above each gate, as shown in FIG. 1B.

Subsequently, as shown in FIG. 1C, the sidewalls film layer is deposited. Specifically, a first sidewalls 490 composed of silicon oxide and a second sidewalls 690 composed of silicon nitride are sequentially deposited, where the silicon nitride layer fills the gaps between adjacent two of the first stacked gates 210 of the memory transistors. Finally, as shown in FIG. 1D, the sidewalls are etched to remove the silicon nitride layer above the upper surfaces of the silicon oxide layer over the silicon nitride mask layer 311, but the silicon nitride layer on the sidewalls is kept untouched as the second sidewalls 690.

In the step of removing the silicon oxide mask layer above each stacked gate as shown in FIG. 1B, considering that the silicon oxide material is also used in the interlayer dielectric layer 212, in order to avoid mistakenly etching the silicon oxide material in the interlayer dielectric layer in this step, the wet etching process is limited to vapor phase wet etching, which requires a new type of process equipment, so manufacturing cost will be inevitably increased.

In view of this, there is an urgent need for a method to remove silicon oxide mask layers of uneven thicknesses above stacked gates, without introducing a new machine, this method should be compatible with the rest of existing process and existing equipment, and should not damage materials of other film layers such as the interlayer dielectric layer.

BRIEF SUMMARY

A brief summary of one or more embodiments is given below to provide a basic understanding of these embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

To solve the problem in the current practice that a new machine needs to be introduced when etching and removing the silicon oxide mask layers with different heights above each stacked gate without affecting the film materials such as interlayer dielectric layers and other film layers, the present disclosure provides a method for manufacturing a semiconductor device, which specifically includes: providing a substrate on which a plurality of stacked gates are formed, a mask layer made of silicon nitride/silicon oxide is formed above each stacked gate;

depositing a first carbon-containing silicon oxide thin layer, wherein the first carbon-containing silicon oxide thin layer covers the substrate, the stacked gates and the mask layers above the stacked gates;

depositing a second non-carbon-containing silicon oxide layer on the surface of the first silicon oxide thin layer, wherein the second silicon oxide layer fills the gaps between a plurality of stacked gates;

planarizing the first silicon oxide thin layer and the second silicon oxide layer by taking the top surface of the silicon nitride mask layer as a stop layer and removing the mask layers above the stacked gates; and removing the second silicon oxide layer and retaining the first silicon oxide thin layer on the sidewalls of the stacked gates as the first sidewalls of the stacked gates.

In an embodiment of the foregoing manufacturing method, optionally, removing the second silicon oxide layer further includes:

wet etching the second silicon oxide layer by using a reagent having high selection ratio for the carbon-containing silicon oxide and non-carbon-containing silicon oxide.

In an embodiment of the above manufacturing method, optionally, the reagent is a diluted hydrofluoric acid.

In an embodiment of the above manufacturing method, optionally, the planarization is performed by chemical mechanical polishing.

In an embodiment of the above manufacturing method, optionally, the method further includes:

depositing a third carbon-containing silicon oxide thin layer on the side surface of the retained first silicon oxide thin layer and the top surface of the stacked gates;

depositing a silicon nitride layer on the surface of the third silicon oxide thin layer; and removing the silicon nitride layer above the stacked gates by taking the top surface of the third silicon oxide thin layer as a stop layer, and retaining the silicon nitride layers on both sides of the stacked gates as the second sidewalls of the stacked gates.

In an embodiment of the above manufacturing method, optionally, the stacked gate comprises: a floating gate film layer, an interlayer dielectric layer, and a control gate film layer are sequentially formed above the substrate from bottom to top.

In an embodiment of the above manufacturing method, optionally, the interlayer dielectric layer is a silicon oxide-silicon nitride-silicon oxide layer.

In an embodiment of the above manufacturing method, optionally, a gate dielectric layer is further formed on the upper surface of the substrate, and the stacked gates are formed on the upper surface of the gate dielectric layer.

In an embodiment of the above manufacturing method, optionally, the stacked gates are further divided into:

a first stacked gate as a storage transistor in a storage area;

a second stacked gate as a selection transistor in a storage area; and a third stacked gate as a peripheral transistor in a peripheral storage area; wherein the first stacked gate, the second stacked gate, and the third stacked gate have the same height, and the width of the first stacked gate is smaller than that of the second stacked gate and the third stacked gate.

In an embodiment of the above manufacturing method, optionally, the thickness of the silicon oxide mask layer above the first stacked gate is smaller than the thickness of the silicon oxide mask layer above the second stacked gate and the third stacked gate.

The present disclosure further provides a semiconductor device manufactured by the manufacturing method described in any one of the above embodiments.

According to the manufacturing method provided in one embodiment of the present disclosure, the etching rate of carbon-containing silicon oxide by the wet etching process is significantly lower than that of other silicon oxides, while the polishing rate of silicon oxides with different materials in the chemical mechanical polishing method are not obviously affected, adopting the chemical mechanical polishing method to remove the silicon oxide layer above the gate, and the interlayer dielectric layer in the stacked gate is protected due to the existence of the carbon-containing silicon oxide layer, so that the stacked gate structure keeps the original structure and does not have a negative influence on the gate performance. And a structure basically the same as that under the original process is obtained.

Another embodiment of the present disclosure also provides a semiconductor device manufactured according to the above manufacturing method. It can be understood that the semiconductor device formed according to the manufacturing method provided according to one embodiment of the present disclosure retains the carbon-containing silicon oxide as the sidewalls layer of the stacked gate, and since the carbon-containing silicon oxide layer has a better blocking effect than the non-carbon-containing silicon oxide layer, therefore, taking the carbon-containing silicon oxide layer as the sidewalls layer of the stacked gate can further reduce the crosstalk between the gates, thereby the performance of the entire semiconductor device is more excellent.

BRIEF DESCRIPTION OF THE DRAWINGS

The above-mentioned features and advantages of the present disclosure can be better understood by the following detailed description of the embodiments of the present disclosure in conjunction with the following drawings. In the drawings, the components are not necessarily drawn to scale, and components with similar related characteristics or features may have the same or similar reference numbers.

Figure 1A:
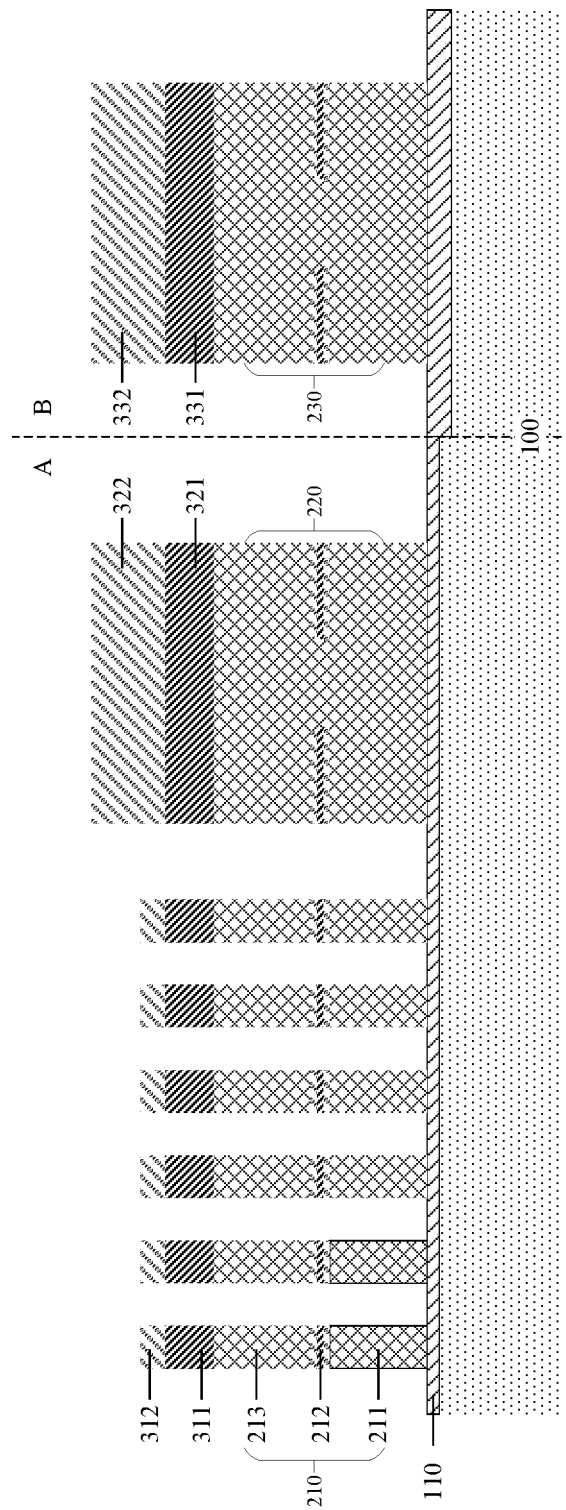
FIG. 1A to 1D show schematic structural diagrams after executing each step in the method for eliminating the thickness difference in the mask layers above the stacked gates in the existing practice.
Figure 1B:
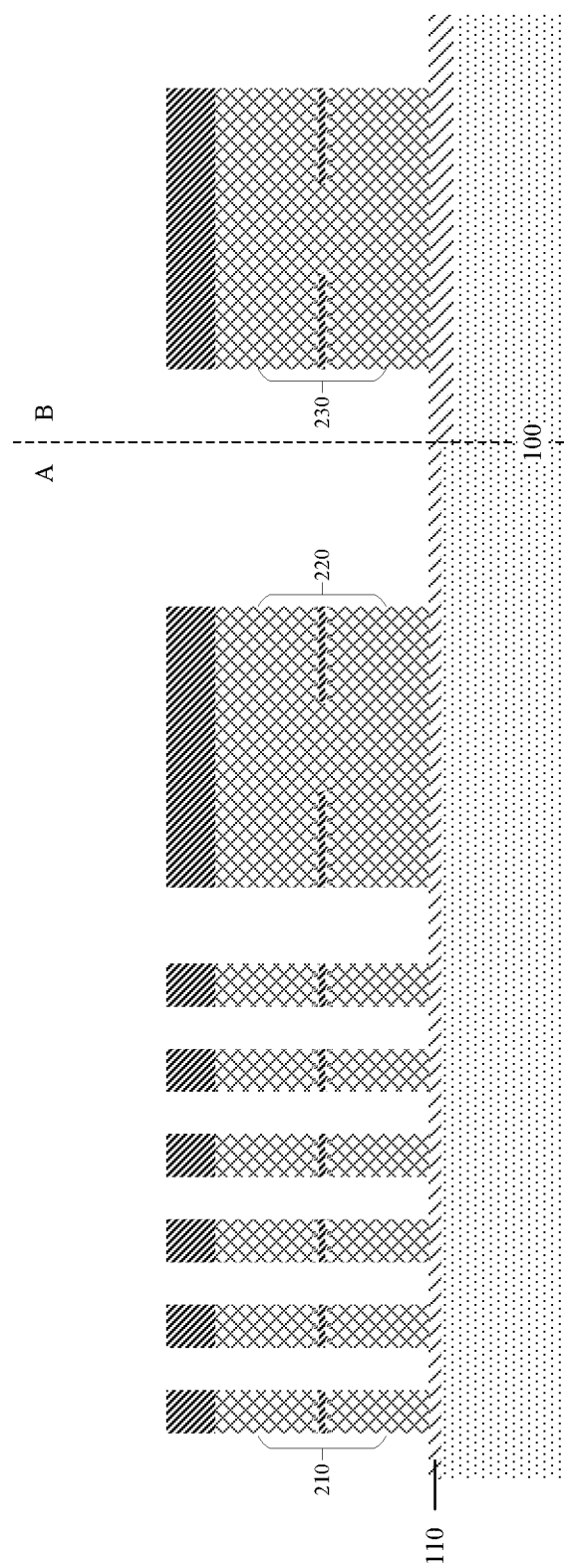
Figure 1C:
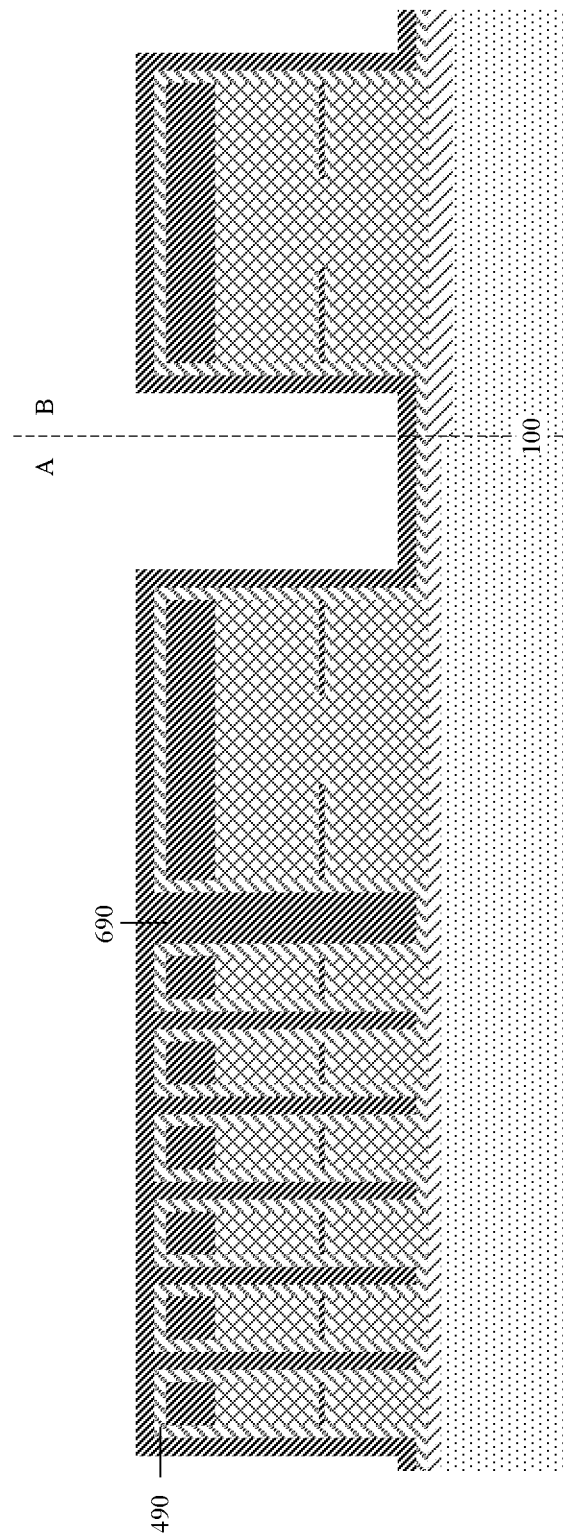

REFERENCE NUMERALS 100 substrate
110 gate dielectric layer
210 first stacked gate
211 floating gate film layer
212 interlayer dielectric layer
213 control gate film layer
220 second stacked gate
230 third stacked gate
311, 321, 331 silicon nitride mask layers for the first, second and third stacked gates
312, 322, 332 silicon oxide mask layers for the first, second and third stacked gates
400, 490 first sidewalls 600, 690 second sidewalls
410 first silicon oxide thin layer
420 third silicon oxide thin layer
500 second silicon oxide layer
620 silicon nitride layer

DETAILED DESCRIPTION OF THE DISCLOSURE

The following description is given to enable those skilled in the art to implement and use the present disclosure and incorporate it into the context of specific applications. Various modifications and various uses in different applications will be readily apparent to those skilled in the art, and general principles defined herein can be applied to a wide range of embodiments. Therefore, the present disclosure is not limited to the embodiments given herein, but should be granted the broadest scope consistent with the principles and novel features disclosed herein.

The present disclosure relates to a device structure of a flash memory device and manufacturing process thereof. According to one embodiment of the present disclosure, the method for manufacturing a flash memory device provided can make full use of the characteristic that the etching rate of carbon-containing silicon oxide in the wet etching process is significantly lower than that of other silicon oxides, while the polishing rate of different materials of silicon oxide in the chemical mechanical polishing method is not obviously influenced; and by adopting the chemical mechanical polishing method, a process compatible with the prior art can be adopted, and the silicon oxide mask layer above the gate can be removed without adding additional machines and increasing manufacturing process costs, thereby a structure substantially the same as that under the original process can be obtained.

In the following detailed description, many specific details are set forth to provide a more thorough understanding of the present disclosure. However, it is obvious to those skilled in the art that the practice of the present disclosure may not necessarily be limited to these specific details. In other words, well-known structures and devices are shown in block diagram form and not shown in detail to avoid obscuring the present disclosure.

Readers are requested to pay attention to all files and documents submitted at the same time as this description and open to the public to consult this description, and the contents of all such files and documents are incorporated herein by reference. Unless directly stated otherwise, all the features disclosed in this description (including any appended claims, abstract and drawings) can be replaced by alternative features for achieving the same, equivalent or similar purpose. Therefore, unless explicitly stated otherwise, each feature disclosed is only an example of a set of equivalent or similar features.

Note that when used, the signs left, right, front, back, top, bottom, forward, reverse, clockwise and counterclockwise are only used for convenience, and do not imply any specific fixed direction. In fact, they are used to reflect the relative position and/or orientation between various parts of an object.

As used herein, the terms "over", "under", "between" and "on" refer to the relative position of this layer relative to other layers. Likewise, for example, a layer deposited or placed above or below another layer may directly contact another layer or there may have one or more intermediate layers. In addition, a layer that is deposited or placed between the layers may be in direct contact with these layers or there may be one or more intermediate layers. In contrast, the first layer "on" the second layer is in contact with the second layer. In addition, the relative position of one layer relative to the other layers is provided (assuming that the deposition, modification, and removal operations are performed relative to the starting substrate without considering the absolute orientation of the substrate).

The present disclosure will be described in detail below with reference to the drawings and specific embodiments. Note that the following embodiments described in conjunction with the drawings and specific embodiments are only exemplary, and should not be construed as limiting the protection scope of the present disclosure in any way.

Figure 2:
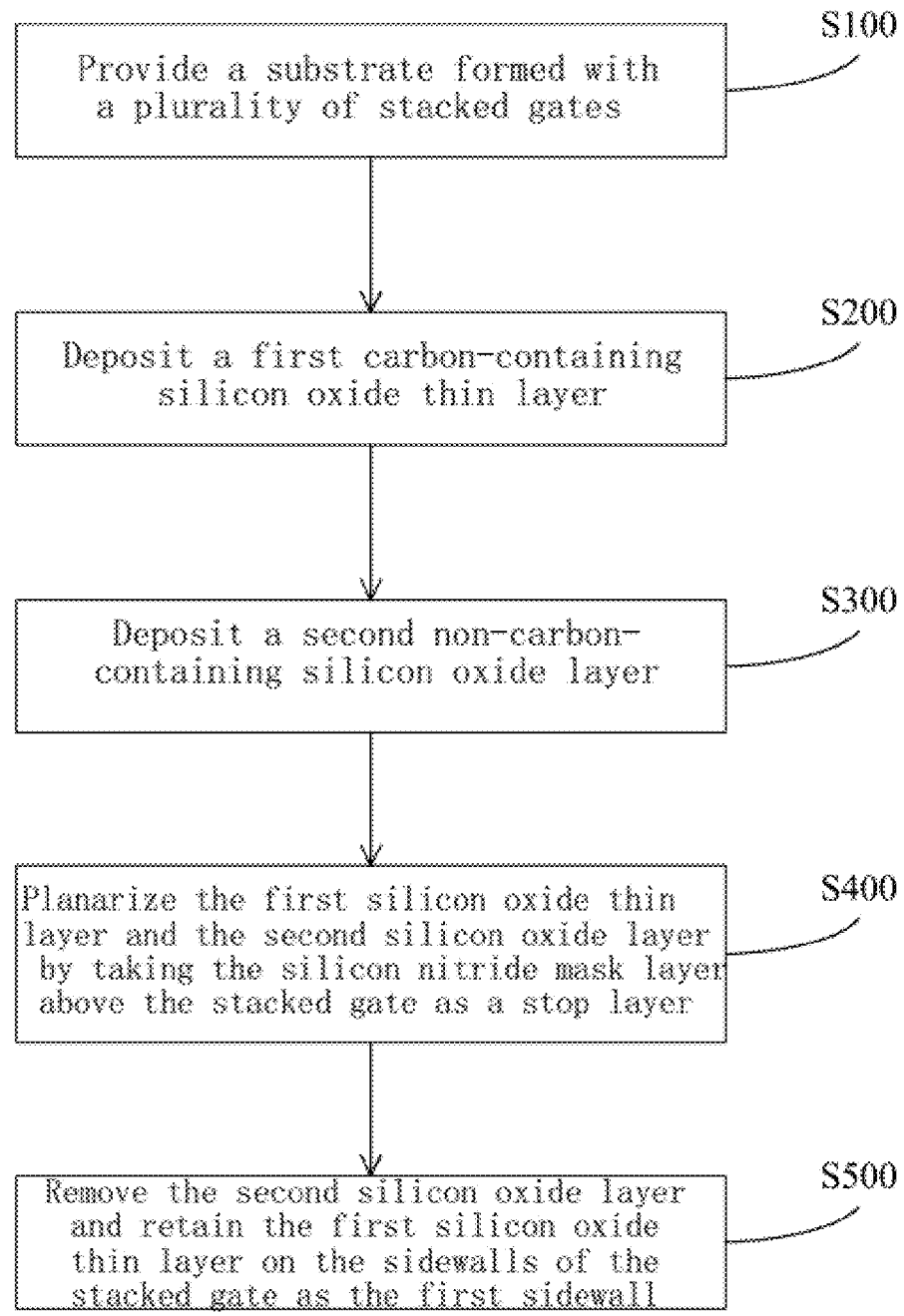
FIG. 2 shows a schematic flowchart of an embodiment of a method for manufacturing a semiconductor device according to one embodiment of the present disclosure.

As mentioned above, in order to use a method compatible with the existing process to remove the hard mask layer with different heights above the stacked gate, the present disclosure provides a method for manufacturing a semiconductor device. Refer to FIG. 2 to understand the manufacturing method provided by the present disclosure. As shown in FIG. 2, the manufacturing method provided by the present disclosure specifically includes step S100: providing a substrate formed with a plurality of stacked gates; step S200: depositing a first carbon-containing silicon oxide thin layer; step S300: depositing a second non-carbon-containing silicon oxide layer; step S400: planarizing the first silicon oxide thin layer and the second silicon oxide layer by taking the top surface of the silicon nitride mask layer above the stacked gate as a stop layer; and step S500: removing the second silicon oxide layer and remaining the first silicon oxide thin layer on the sidewalls of the stacked gate as the first sidewalls.

Figure 3A:
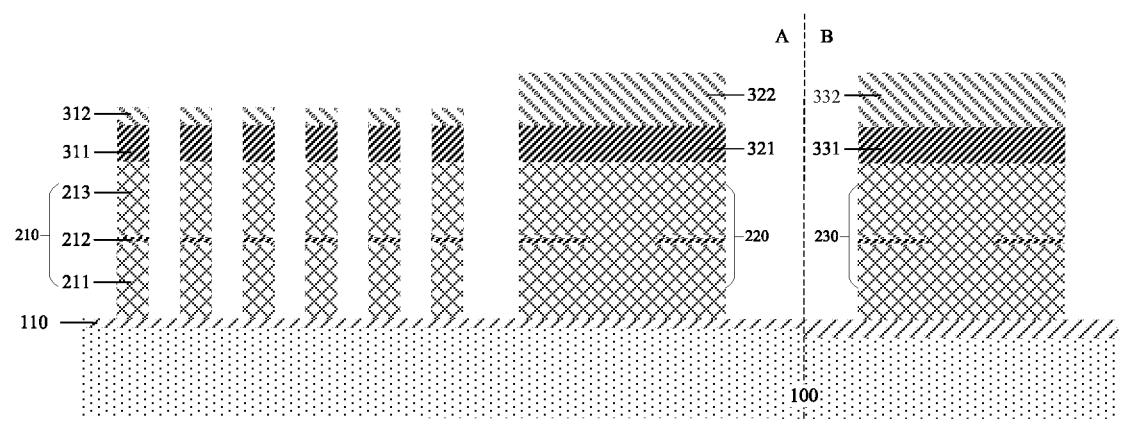
FIGS. 3A-3G show schematic structural diagrams after executing each major step of the method for manufacturing a semiconductor device provided by one embodiment of the present disclosure.

In the above step S100, referring to FIG. 3A, after the gate etching process, stacked gate structures of different devices have been formed on the substrate 100. Specifically, a memory transistor and a selection transistor are formed on the substrate of the storage area A, and various peripheral devices are formed on the substrate of the peripheral area B. After the gate etching process, the first stacked gate 210 of the memory transistor, the second stacked gate 220 of the selection transistor, and the third stacked gate 230 of the peripheral device have been formed. Taking the first stacked gate 210 as an example, the film structure of the stacked gate is a control gate film layer 213, an interlayer dielectric layer 212, and a floating gate film layer 211 from top to bottom. It can be understood that the film structures of the second stacked gate 220 and the third stacked gate 230 are also a control gate film layer, an interlayer dielectric layer, and a floating gate film layer from top to bottom.

In an embodiment, silicon nitride mask layers 311, 321, and 331 with the same thickness are further formed above all stacked gates respectively. The control gate film layer 213 and the floating gate film layer 211 may use existing or future gate materials, including but not limited to polysilicon or metal gate materials. And the interlayer dielectric layer 212 is usually a silicon oxide-silicon nitride-silicon oxide layer, that is, an ONO layer.

In an embodiment, a gate dielectric layer 110 is further formed between the stacked gates and the substrate. The material of the above-mentioned gate dielectric layer may be an existing or future gate dielectric material, including but not limited to silicon oxide or high dielectric constant material.

A silicon oxide mask layer is further formed above each stacked gate silicon nitride mask layer. Since the film layers before etching are different and the gate width of the control transistor is narrower than that of the selection transistor and the peripheral transistor, the thickness of the silicon oxide mask layer 312 above the first stacked gate 210 is smaller than the thickness of the silicon oxide mask layer 322 above the second stacked gate 220 and the silicon oxide mask layer 332 above the third stacked gate 230.

Figure 3B:
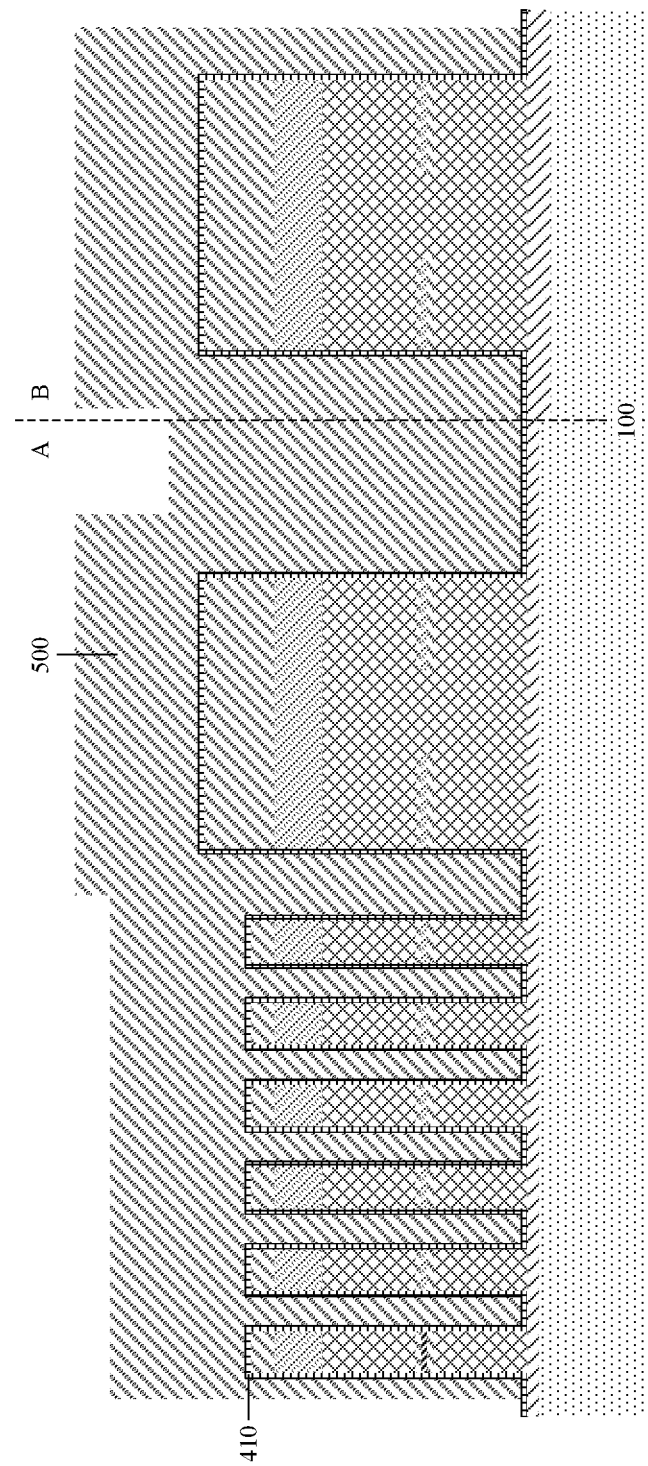

In order to be able to eliminate the above-mentioned thickness difference through a process method compatible with the existing process, the manufacturing method provided in one embodiment of the present disclosure first forms a carbon-containing silicon nitride layer on the basis of FIG. 3A (step S200). As shown in FIG. 3B, a first carbon-containing silicon oxide thin layer 410 is disposed on the upper surfaces of the substrate 100, each of the stacked gates, the side surfaces and top surfaces of the silicon nitride mask layer and the silicon oxide mask layer in the areas above the stacked gates.

After the first carbon-containing silicon oxide thin layer 410 is formed, a second non-carbon-containing silicon oxide layer 500 is formed on the upper surfaces of the first silicon oxide thin film 410 (step S300). As shown in FIG. 3B, the second non-carbon-containing silicon oxide layer 500 fills the gaps between the adjacent stacked gates. The top surface of the second silicon oxide layer 500 is at least above the top surfaces of the silicon nitride mask layers 321 and 331 over the second stacked gate 220 and the third stacked gate 230.

Figure 3C:
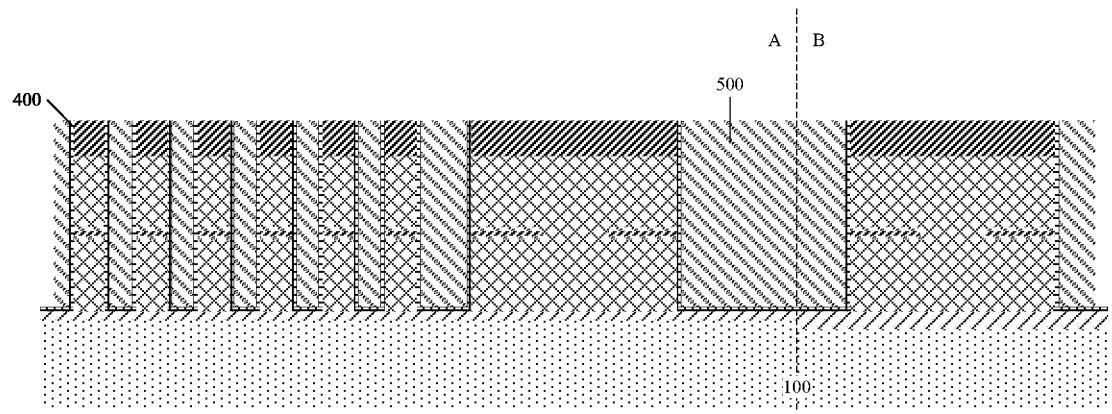

Subsequently, step S400 is performed to perform chemical mechanical polishing CMP on the silicon nitride mask layers 311, 321, and 331 above the stacked gate, so that the top surfaces of all stacked gates will be planarized. Referring to FIG. 3C, since the polishing rate of the chemical mechanical polishing process is not affected by the two silicon oxide layers containing different materials, the silicon oxide mask layer of uneven thickness above the stacked gates can be removed in step S400 as there are stop layers formed by the top surfaces of the silicon nitride mask layers 311, 321, and 331. The second non-carbon-containing silicon oxide layer 500 formed in step S300 fills the gaps between the adjacent stacked gates, and the top surface of the second non-carbon-containing silicon oxide layer 500 is above the upper surfaces of the silicon nitride mask layers 321 and 331 which are disposed above the second and third stacked gates. This structure ensures the stability of the overall structure when performing the chemical mechanical polishing in step S400, and the device will not collapse due to uneven stresses during the chemical mechanical polishing.

Subsequently, step S500 is performed to remove the remaining second silicon oxide layer while retaining the first carbon-containing silicon oxide thin layer as the first sidewalls 400 in each of the stacked gates.

In the above step S500, the second silicon oxide layer is etched with a reagent having a high selection ratio for carbon-containing silicon oxide and non-carbon-containing silicon oxide to remove the second silicon oxide layer. In a preferred embodiment, the above reagent may be diluted hydrofluoric acid (DHF). The carbon-containing silicon oxide and the non-carbon-containing silicon oxide have different wet etching rates under the action of the DHF reagent. Therefore, in step S500, the non-carbon-containing silicon oxide can be smoothly removed and the carbon-containing silicon oxide on the sidewalls of each stacked gate is retained as the first sidewalls.

And since the sidewalls of each stacked gate are formed with a non-carbon-containing silicon oxide layer, the non-carbon-containing silicon oxide layer can also protect the interlayer dielectric layer which also contains silicon oxide material in the wet cleaning process, thereby avoiding the erroneous-etching of the interlayer dielectric layer caused by certain common existing processes.

After the above description, the silicon oxide mask layers of different thicknesses above the stacked gates can be removed by a process compatible with the existing process flow. It can be understood that for a flash memory device, after step S500, sidewalls composed of silicon nitride need to be formed on both sides of each of the stacked gates.

Therefore, after step S500, another embodiment of the present disclosure also provides a step of forming sidewalls composed of silicon nitride material, which includes:

depositing a third carbon-containing silicon oxide thin layer on the side surface of the retained first silicon oxide thin layer and the upper surface of the silicon nitride mask layer above the stacked gate;

depositing a silicon nitride layer on the surface of the third silicon oxide thin layer; and etching and removing the silicon nitride layer from above the stacked gate by using the top surface of the third silicon oxide thin layer as a stop layer, and keeping the silicon nitride layer intact on both sides of the stacked gate as the second sidewalls of the stacked gate.

Figure 3D:
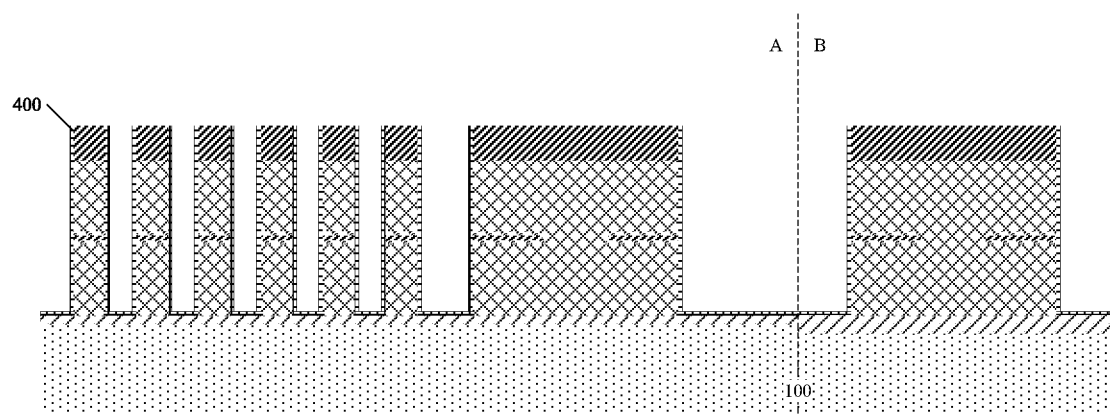
Figure 3E:
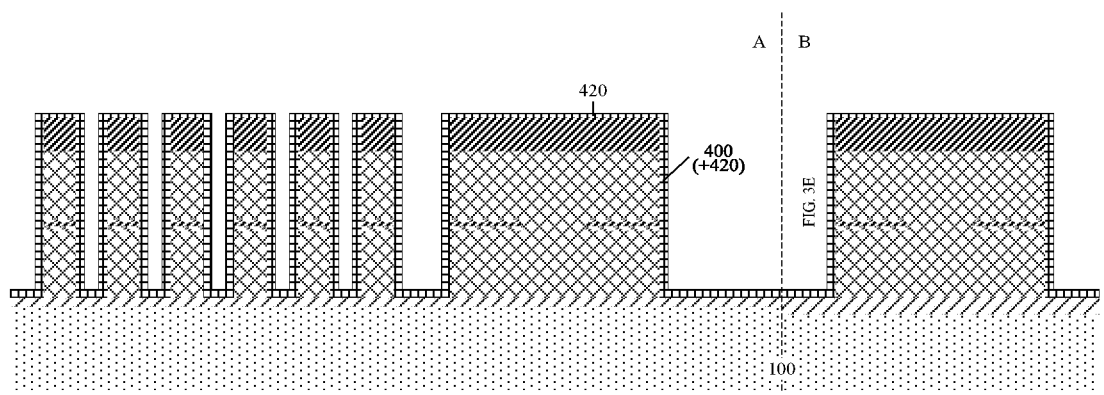

Referring to FIGS. 3C and 3D, in step S400, the carbon-containing silicon oxide thin layer above each stacked gate is removed by chemical mechanical polishing, which is equivalent to re-exposing the silicon nitride mask layer 311, 321, and 331 above the stacked gate. And the second sidewalls on both sides of the stacked gate also compose of silicon nitride, in order to form the second composed of silicon nitride on both sides of the stacked gate under control without affecting the thickness of the silicon nitride mask layers 311, 321, and 331 above the stacked gates, it is first necessary to deposit a carbon-containing third silicon oxide thin layer 420 on the side surface of the retained first silicon oxide thin layer and the top surfaces of the silicon nitride mask layers 311, 321, and 331 above the stacked gates, as shown in FIG. 3E.

It can be understood that, because the third carbon-containing silicon oxide thin layer 420 is deposited again on the sidewalls of the stacked gate, the first sidewalls 400 of the stacked gate sidewalls is actually composed of the first silicon oxide thin layer 410 and the third silicon oxide thin layer 420.

Figure 1D:
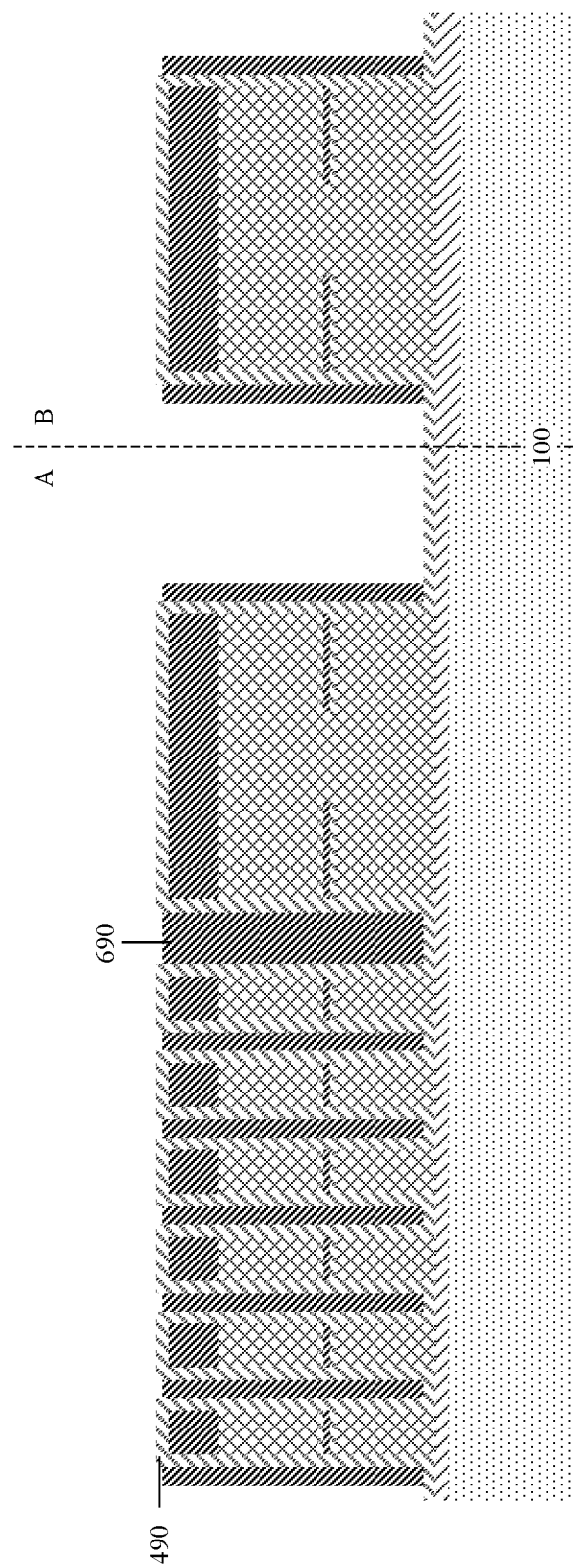

In a preferred embodiment, it is expected that the same device structure as the flash memory device shown in FIG. 1D can be formed through the manufacturing process provided by the present disclosure. Therefore, it is expected that the thickness of the first sidewalls 400 is consistent with that of the first sidewalls 490 shown in FIG. 1D. For this reason, the thicknesses of the first silicon oxide thin layer 410 and the third silicon oxide thin layer 420 can be controlled respectively when the first silicon oxide thin layer 410 and the third silicon oxide thin layer 420 are formed, so that the sum of the thicknesses of the first silicon oxide thin layer 410 and the third silicon oxide thin layer 420 equals to that of the first sidewalls 490.

Figure 3F:
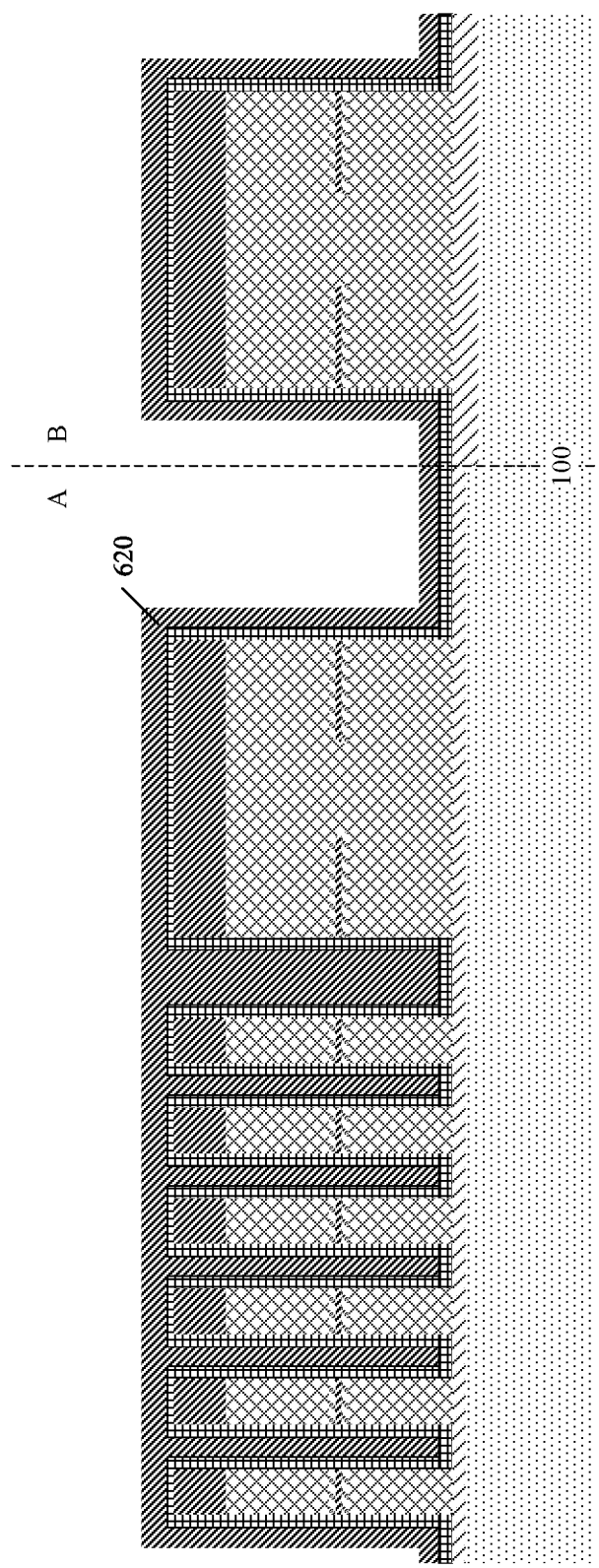

Subsequently, as shown in FIG. 3F, a silicon nitride layer 620 is formed on the upper surface of the third carbon-containing silicon nitride thin layer. In a preferred embodiment, the thickness of the silicon nitride layer 620 formed in this step can have the thickness of the second sidewalls 600 formed later and the thickness is consistent with that of the second sidewalls 690 shown in FIG. 1D.

It can be understood that the third carbon-containing silicon oxide thin layer 420 is re-formed on the upper surface of the silicon nitride mask layer above the stacked gate, so that the deposited silicon nitride layer can be separated from the silicon nitride mask layer above the stacked gate, so as to ensure that the stacked gates and the silicon nitride mask layer above the stacked gates will not be negatively affected in the process of forming the second sidewalls.

Subsequently, referring to FIG. 3G, the second sidewalls 600 are etched, and the silicon nitride layer 620 formed above the stacked gates is removed by applying the third silicon oxide thin layer 420 above the stacked gates as a stop layer, while the area that is incompletely filled at the bottom of the gates also remain on the third silicon oxide thin layer 420.

Figure 3G:
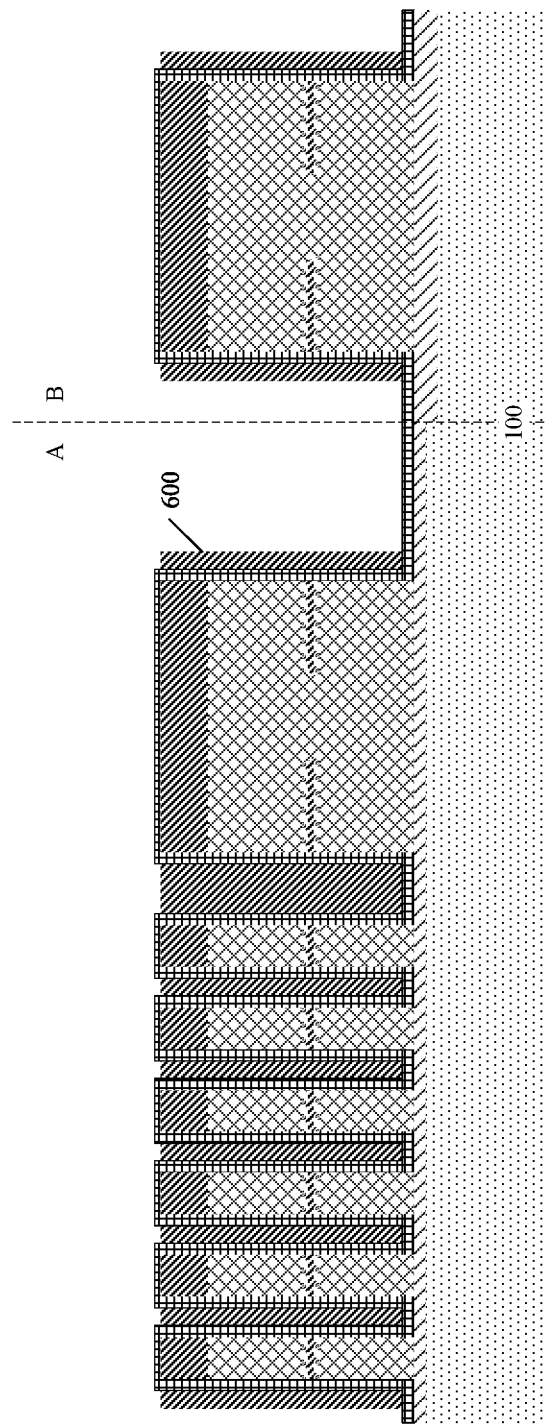

Comparing FIG. 1D and FIG. 3G, it can be found that the semiconductor device structure formed according to the manufacturing method provided in one embodiment of the present disclosure retains the device structure in the prior art except for the difference in the material of the first sidewalls. At the same time, since the first sidewalls 400 formed in one embodiment of the present disclosure is made of carbon-containing silicon oxide, it has better blocking ability and can more effectively reduce the crosstalk between the gates, therefore, compared with the existing techniques, improving the performance of the device the performance of the device can be better improved.

So far, the manufacturing method provided by one embodiment of the present disclosure has been described. According to the manufacturing method provided in one embodiment of the present disclosure, the etching rate of carbon-containing silicon oxide by making full use of the wet etching process is obviously lower than that of other silicon oxides, while the chemical mechanical polishing method has no obvious influence on the polishing rate of silicon oxides with different materials, adopting the chemical mechanical polishing method to remove the silicon oxide layer above the gate, and because of the existence of the carbon-containing silicon oxide layer, the interlayer dielectric layer in the stacked gates is protected, so that the stacked gate structure keeps the original structure and will not have negative influence on the gate performance. And a structure basically the same as that under the original process is obtained.

The manufacturing method provided in one embodiment of the present disclosure reduces the dependence on new machines, ensures the process window of the subsequent process, and enhances the competitiveness of the process.

Another embodiment of the present disclosure also provides a semiconductor device manufactured according to the above manufacturing method. It can be understood that the semiconductor device formed according to the manufacturing method provided according to one embodiment of the present disclosure retains carbon-containing silicon oxide as the sidewalls layer of the stacked gate, and since the carbon-containing silicon oxide layer has a better blocking effect than the non-carbon-containing silicon oxide layer. Therefore, applying the carbon-containing silicon oxide layer as the sidewalls layer of the stacked gates can further reduce the crosstalk between the gates, so that the performance of the entire semiconductor device is more improved.

Although the present disclosure has been described with respect to specific exemplary embodiments, it will be apparent that various modifications and changes can be made to these embodiments without departing from the broader spirit and scope of the present disclosure. Therefore, this description and drawings should be regarded as illustrative rather than restrictive.

It should be understood that this specification will not be used to interpret or limit the scope or meaning of the claims. Furthermore, in the foregoing detailed description, it can be seen that various features are combined together in a single embodiment for the purpose of streamlining the present disclosure. This method of the present disclosure should not be interpreted as reflecting the purpose that the claimed embodiments require more features than those explicitly listed in each claim. On the contrary, as reflected in the appended claims, the inventive subject matter lies in less than all the features of a single disclosed embodiment. Therefore, the appended claims are hereby incorporated into the detailed description, with each claim independently as a separate embodiment.

An embodiment or embodiments mentioned in this description is intended to be included in at least one embodiment of a device or a method in combination with the specific features, structures, or characteristics described in the embodiments. The appearances of the phrase one embodiment in various places in the specification do not necessarily all refer to the same embodiment.

The invention claimed is:

1. A method for manufacturing a semiconductor device, comprising steps of: providing a substrate comprising a plurality of stacked gates; forming a silicon nitride mask layer and a silicon oxide mask layer sequentially above each of the plurality of stacked gates; depositing a first silicon oxide layer on the substrate, the plurality of stacked gates, the silicon nitride mask layer, and the silicon oxide mask layer; depositing a second silicon oxide layer on a surface of the first silicon oxide layer, wherein the second silicon oxide layer fills gaps between adjacent ones of the plurality of stacked gates; planarizing the first silicon oxide layer and the second silicon oxide layer and removing the second silicon oxide layer by applying a top surface of the silicon nitride mask layer as a stop layer; removing the second silicon oxide layer; and forming first sidewalls for each of the plurality of stacked gates by keeping the first silicon oxide layer on sides of each said stacked gate.

2. The manufacturing method of claim 1, wherein removing the second silicon oxide layer comprises steps of: etching the second silicon oxide layer with a reagent which has a high etch selection ratio between carbon-containing silicon oxide and non-carbon-containing silicon oxide.

3. The manufacturing method of claim 2, wherein the reagent is a diluted hydrofluoric acid.

4. The manufacturing method of claim 1, wherein the planarizing is performed by chemical mechanical polishing.

5. The manufacturing method of claim 1, further comprising: depositing a third silicon oxide layer on side surfaces of the first silicon oxide layer and a top surface of the silicon nitride mask layer; depositing a silicon nitride layer on a top surface of the third silicon oxide layer; and removing the silicon nitride layer from above the plurality of stacked gates by applying the top surface of the third silicon oxide layer as a stop layer, keeping the silicon nitride layers on both sides of each of the plurality of stacked gates as a second sidewalls of the said stacked gates.

6. The manufacturing method of claim 1, wherein the plurality of stacked gates comprises: a floating gate film layer, an interlayer dielectric layer, and a control gate film layer sequentially formed above the substrate from bottom up.

7. The manufacturing method of claim 6, wherein the interlayer dielectric layer is a silicon oxide-silicon nitride-silicon oxide layer.

8. The manufacturing method of claim 1, further comprising forming a gate dielectric layer on a upper surface of the substrate, wherein the plurality of stacked gates is formed on a upper surface of the gate dielectric layer.

9. The manufacturing method of claim 1, wherein the plurality of stacked gates further comprise:

a first stacked gate of a storage transistor in a storage area;
a second stacked gate of a selection transistor in the storage area; and
a third stacked gate of a peripheral transistor in a peripheral area; wherein
the first stacked gate, the second stacked gate, and the third stacked gate have a same height, and wherein a width of the first stacked gate is smaller than a width of the second stacked gate, and the width of the first stacked gate is also smaller than a width of the third stacked gate.

10. The manufacturing method of claim 9, wherein a thickness of the silicon oxide mask layer which is above the first stacked gate is smaller than a thickness of the silicon oxide mask layer which is above the second stacked gate and the third stacked gate.

\* \* \* \* \*